(12) United States Patent
Hwang et al.

(10) Patent No.: US 9,349,914 B2
(45) Date of Patent: May 24, 2016

(54) LIGHT EMITTING DEVICE AND LIGHT EMITTING DEVICE PACKAGE

(71) Applicant: LG INNOTEK CO., LTD., Seoul (KR)

(72) Inventors: Jung Hyun Hwang, Seoul (KR); Oh Min Kwon, Seoul (KR); Jong Hak Won, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/837,688

(22) Filed: Mar. 15, 2013

(65) Prior Publication Data

US 2014/0034902 A1 Feb. 6, 2014

(30) Foreign Application Priority Data

Aug. 6, 2012 (KR) .................. 10-2012-0086010

(51) Int. Cl.
*H01L 29/06* (2006.01)
*H01L 33/14* (2010.01)
*H01L 33/06* (2010.01)

(52) U.S. Cl.
CPC ............... *H01L 33/14* (2013.01); *H01L 33/06* (2013.01)

(58) Field of Classification Search
CPC .............................. H01L 33/06; H01L 33/01
USPC .......................................................... 257/13
See application file for complete search history.

(56) References Cited

U.S. PATENT DOCUMENTS

| | | | | |
|---|---|---|---|---|
| 6,657,234 B1* | 12/2003 | Tanizawa | ............... | B82Y 20/00 257/103 |
| 7,829,882 B2* | 11/2010 | Kim et al. | ....................... | 257/14 |
| 2002/0104996 A1* | 8/2002 | Kuo et al. | ....................... | 257/79 |
| 2003/0118066 A1* | 6/2003 | Bour et al. | ....................... | 372/45 |
| 2005/0067613 A1* | 3/2005 | Kim | ............................... | 257/14 |
| 2005/0098789 A1* | 5/2005 | Kozaki | ........................... | 257/97 |
| 2006/0086932 A1* | 4/2006 | Kim et al. | ....................... | 257/13 |
| 2006/0131558 A1* | 6/2006 | Sato et al. | ....................... | 257/17 |
| 2006/0237733 A1* | 10/2006 | Yamada | ........................ | 257/97 |
| 2007/0176203 A1* | 8/2007 | Kuramoto | ..................... | 257/192 |
| 2007/0272936 A1* | 11/2007 | Shin | ............................. | 257/97 |
| 2008/0203418 A1* | 8/2008 | Yanamoto | ...................... | 257/98 |
| 2008/0230794 A1* | 9/2008 | Yasuda et al. | .................. | 257/96 |
| 2008/0315244 A1* | 12/2008 | Kim et al. | ..................... | 257/101 |
| 2009/0152586 A1* | 6/2009 | Lee et al. | ..................... | 257/103 |
| 2009/0166668 A1* | 7/2009 | Shakuda | ....................... | 257/103 |
| 2009/0212278 A1* | 8/2009 | Jorgenson | ............ | H01L 33/405 257/13 |
| 2009/0224226 A1* | 9/2009 | Huang | .................... | H01L 33/06 257/13 |
| 2010/0009484 A1* | 1/2010 | Akita | .................. | H01L 21/0262 438/46 |
| 2010/0046205 A1* | 2/2010 | Chu et al. | ..................... | 362/97.1 |
| 2010/0096650 A1* | 4/2010 | Ubahara | ......................... | 257/94 |
| 2010/0127239 A1* | 5/2010 | Park et al. | ....................... | 257/13 |
| 2010/0133506 A1* | 6/2010 | Nakanishi et al. | .............. | 257/13 |

(Continued)

FOREIGN PATENT DOCUMENTS

JP 2004-015072 * 1/2004

*Primary Examiner* — Phat X Cao
*Assistant Examiner* — Mohammad M Hoque
(74) *Attorney, Agent, or Firm* — KED & Associates, LLP

(57) ABSTRACT

Disclosed are a light emitting device and a light emitting device package. The light emitting device includes a first conductive semiconductor layer, an active layer on the first conductive semiconductor layer, and a second conductive semiconductor layer on the active layer. The active layer includes (T+1) barrier layers, T well layers between the (T+1) barrier layers, and a first dummy layer between N well layers adjacent to the second conductive semiconductor layer and N barrier layers adjacent to the N well layers, in which T>N≥1.

16 Claims, 8 Drawing Sheets

(56) References Cited

U.S. PATENT DOCUMENTS

| | | | |
|---|---|---|---|
| 2010/0252811 A1* | 10/2010 | Kozaki | 257/14 |
| 2010/0288998 A1* | 11/2010 | Kikuchi et al. | 257/13 |
| 2010/0288999 A1* | 11/2010 | Kikuchi et al. | 257/13 |
| 2011/0037049 A1* | 2/2011 | Tachibana et al. | 257/13 |
| 2011/0095331 A1* | 4/2011 | Hanawa et al. | 257/99 |
| 2011/0101340 A1* | 5/2011 | Son | 257/43 |
| 2011/0187294 A1* | 8/2011 | Bergmann | H01L 33/04 315/363 |
| 2011/0227039 A1* | 9/2011 | Moon | 257/13 |
| 2011/0284821 A1* | 11/2011 | Moon | B82Y 20/00 257/13 |
| 2011/0309328 A1* | 12/2011 | Kyono et al. | 257/13 |
| 2012/0056157 A1* | 3/2012 | Hikosaka et al. | 257/13 |
| 2012/0119182 A1* | 5/2012 | Kim et al. | 257/9 |
| 2012/0138890 A1* | 6/2012 | Shioda | H01L 33/40 257/13 |
| 2012/0145993 A1* | 6/2012 | Na et al. | 257/13 |
| 2012/0189030 A1* | 7/2012 | Miyoshi | 372/45.012 |
| 2012/0216848 A1* | 8/2012 | Gray | H01L 29/26 136/238 |
| 2012/0286284 A1* | 11/2012 | Tachibana et al. | 257/76 |
| 2012/0298955 A1* | 11/2012 | Emerson et al. | 257/13 |
| 2013/0001637 A1* | 1/2013 | Fudeta | 257/103 |
| 2013/0022074 A1* | 1/2013 | Cerutti et al. | 372/45.012 |
| 2013/0069032 A1* | 3/2013 | Kushibe et al. | 257/13 |
| 2013/0087805 A1* | 4/2013 | Kimura et al. | 257/76 |
| 2014/0166980 A1* | 6/2014 | Goda et al. | 257/13 |

\* cited by examiner

LIGHT EMITTING DEVICE AND LIGHT EMITTING DEVICE PACKAGE

The present application claims priority under 35 U.S.C. §119(a) of Korean Patent Application No. 10-2012-0086010 filed on Aug. 6, 2012, which is hereby incorporated by reference in its entirety.

BACKGROUND

The embodiment relates to a light emitting device.
The embodiment relates to a light emitting device package.
A light emitting diode (LED) is a semiconductor light emitting diode to convert current into light.

When comparing with conventional light sources such as a fluorescent lamp and an incandescent lamp, the light emitting device has advantages in terms of low power consumption, a semi-permanent life span, a rapid response speed, safety, and an eco-friendly property. Accordingly, studies and researches to substitute the conventional light sources with semiconductor light emitting devices have been carried out.

In addition, the light emitting devices are increasingly used according to the trend as light sources of a variety of lamps used in indoor and outdoor places, light sources of lighting devices such as streetlamps, or light sources of display devices such as liquid crystal displays and electronic display.

SUMMARY

The embodiment provides a light emitting device capable of enhancing a color rendering index (CRI).

The embodiment provides a light emitting device capable of improving optical power.

The embodiment provides a light emitting device capable of lowering driving voltage.

According to the embodiment, there is provided a light emitting device including a first conductive semiconductor layer, an active layer on the first conductive semiconductor layer, and a second conductive semiconductor layer on the active layer. The active layer includes (T+1) barrier layers, T well layers between the (T+1) barrier layers, and a dummy layer between N well layers adjacent to the second conductive semiconductor layer and N barrier layers adjacent to the N well layers, in which $T > N \geq 1$.

According to the embodiment, there is provided a light emitting device including a substrate, a first conductive semiconductor layer on the substrate, an active layer on the first conductive semiconductor layer, and a second conductive semiconductor layer on the active layer. The active layer includes first to fourth barrier layers, and first to third well layers between the first to fourth barrier layers. The first barrier layer contacts the first conductive semiconductor layer, the fourth barrier layer contacts the second conductive semiconductor layer, and the third and fourth barrier layers have thicknesses greater than thicknesses of the first and second barrier layers.

According to the embodiment, there is provided a light emitting device package including a body, first and second electrode lines on the body, and a light emitting device on the body and one of the first and second electrode lines. The light emitting device includes a first conductive semiconductor layer, an active layer on the first conductive semiconductor layer, and a second conductive semiconductor layer on the active layer. The active layer includes (T+1) barrier layers, T well layers between the (T+1) barrier layers, and a dummy layer between N well layers adjacent to the second conductive semiconductor layer and N barrier layers adjacent to the N well layers, in which $T > N \geq 1$.

DETAILED DESCRIPTION OF THE EMBODIMENTS

Figure 1:
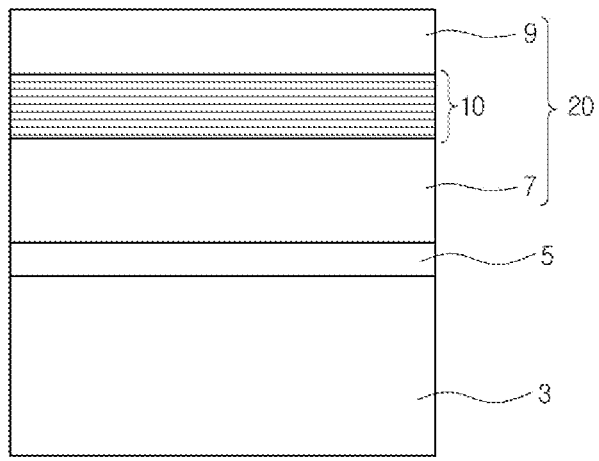
FIG. 1 is a sectional view showing a light emitting device 1 according to the embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

Hereinafter, the embodiment will be described with reference to accompanying drawings. In the drawings, the thickness or size of each layer is exaggerated, omitted, or schematically illustrated for convenience in description and clarity. In the drawings, the thickness or size of each component is exaggerated, omitted, or schematically illustrated for convenience in description and clarity.

FIG. 1 is a sectional view showing a light emitting device 1 according to the embodiment.

Referring to FIG. 1, the light emitting device 1 according to the embodiment may include a substrate 3 and a light emitting structure 20 disposed on the substrate 3.

The substrate 3 may include at least one selected from the group consisting of sapphire ($Al_2O_3$), SiC, Si, GaAs, GaN, ZnO, Si, GaP, InP and Ge.

A buffer layer 5 may be interposed between the substrate 3 and the light emitting structure 20, but the embodiment is not limited thereto.

The buffer layer 5 may be formed to reduce a great lattice constant difference made between the substrate 3 and the light emitting structure 20. In other words, the substrate 3 may be formed thereon with the buffer layer 5, and the buffer layer 5 may be formed thereon with the light emitting structure 20. In this case, since the light emitting structure 20 makes a less lattice constant difference from the buffer layer 3, the light emitting structure 20 may be stably grown from the buffer layer 3 without failure, so that the electrical and optical characteristics can be improved.

The light emitting structure 20 may include a first conductive semiconductor layer 7, an active layer 10, and a second conductive semiconductor layer 9, but the embodiment is not limited thereto.

For instance, the active layer 10 may be disposed on the first conductive semiconductor layer 7, and the second conductive semiconductor layer 9 may be disposed on the active layer 10.

The buffer layer 5, the first conductive semiconductor layer 7, the active layer 10, and the second conductive semiconductor layer 9 may include a group II-VI compound semiconductor material, or a group III-V compound semiconductor material. For instance, the first conductive semiconductor layer 7, the active layer 10, and the second conductive semiconductor layer 9 may include at least one selected from the group consisting of InAlGaN, GaN, AlGaN, InGaN, AlN, InN and AlInN, but the embodiment is not limited thereto.

For instance, the first conductive semiconductor layer 7 may include an N type semiconductor layer including N type dopants, and the second conductive semiconductor layer 9 may include a P type semiconductor layer including P type dopants, but the embodiment is not limited thereto. The N type dopants include Si, Ge, and Sn, and the P type dopants include Mg, Zn, Ca, Sr, and Ba, but the embodiment is not limited thereto.

The active layer 10 may emit light having a wavelength corresponding to the energy bandgap varied depending on a material constituting the active layer 10 through the recombination of first carriers (e.g., electrons), which are injected from the first conductive semiconductor layer 7, and second carriers (e.g., holes) injected through the second conductive semiconductor layer 9.

The active layer 10 may include one of a single quantum well structure (SQW), a multi quantum well (MQW) structure, a quantum dot structure, or a quantum wire structure, but the embodiment is not limited thereto. The active layer 10 may be formed by repeatedly laminating one cycle of well and barrier layers. The number of times to repeat the cycle of the well and barrier layers may vary depending on the characteristics of the light emitting device, but the embodiment is not limited thereto.

For instance, the active layer 10 may include a cycle of InGaN/GaN, a cycle of InGaN/AlGaN, or a cycle of InGaN/InGaN. The bandgap of the barrier layer may be great than that of the well layer.

Although not shown, a third conductive semiconductor layer including conductive dopants the same as those of the first conductive semiconductor layer 7 may be disposed on the second conductive semiconductor layer 9.

Although not shown, a first electrode may be disposed to contact the first conductive semiconductor layer 7, and a second electrode may be disposed to contact the second conductive semiconductor layer 9 or the third conductive semiconductor layer.

The light emitting device 1 may have one of a lateral type structure, a flip-chip type structure, and a vertical type structure.

In the lateral type structure, or the flip-chip type structure, the first electrode may be disposed on the first conductive semiconductor layer 7, and the second electrode may be disposed on the second conductive semiconductor layer 9. That is to say, in the lateral type structure or the flip-chip type structure, the first and second electrodes may be disposed in the same direction.

In the vertical type structure, the first electrode may be disposed on the first conductive semiconductor layer 7, and the second electrode may be disposed under the second conductive semiconductor layer 9. In other words, the vertical type structure, the first and second electrodes may be disposed in directions opposite to each other, and a portion of the first electrode may overlap with a portion of the second electrode, but the embodiment is not limited thereto.

Figure 2:
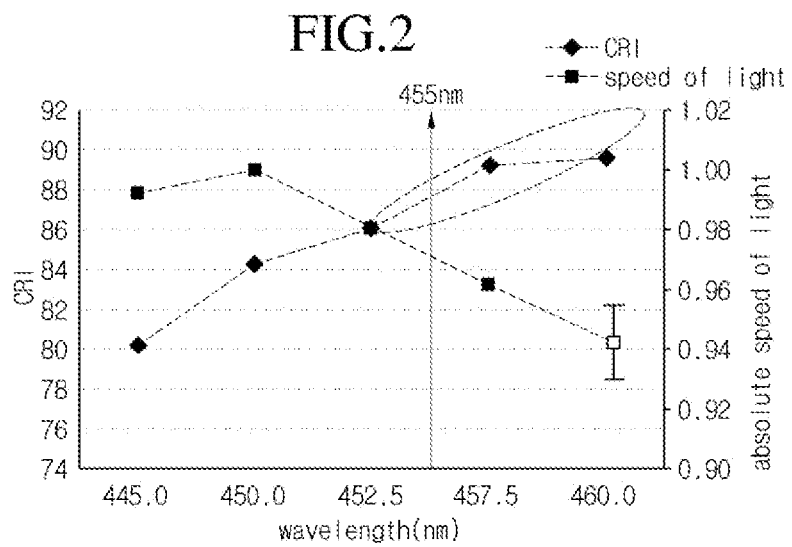
FIG. 2 is a graph showing the relationship between a CRI and optical power.

As shown in FIG. 2, generally, a color rendering index (CRI) is in inverse proportion to optical power.

In other words, as the wavelength of the light emitting device 1 increases, the CRI may increase, and the optical power may decrease. Particularly, in the peak wavelength of less than 450 nm, as a wavelength increases, the CRI increases, and the optical power may increase. However, from the peak wavelength of 450 nm, as the wavelength increases, the CRI increases, but the optical power may decrease.

Accordingly, the development on the light emitting device, which can increase or maintain optical power with the increase of the CRI at the peak wavelength of 450 nm or more, is strongly required.

At the wavelength of 450 nm or more, the characteristic of phosphors deteriorate, and the optical power lowers due to the deterioration of the phosphors.

In order for the light emitting device 1 to have the peak wavelength of 450 nm or more, the energy bandgap of the active layer 10 needs to be adjusted. For instance, when the active layer 10 includes InGaN well/GaN barrier layers, the energy bandgap of the active layer 10 may be varied by adjusting the content of In contained in the well layer. However, if the content of In increase, the quality of the active layer 10 is degraded. Accordingly, in order to compensate for the degraded quality of the active layer 10, the thickness of the barrier layer needs to increase. If a plurality of barrier layers are provided, the degraded quality may be compensated by increasing the whole thickness of the barrier layers.

Figure 3:
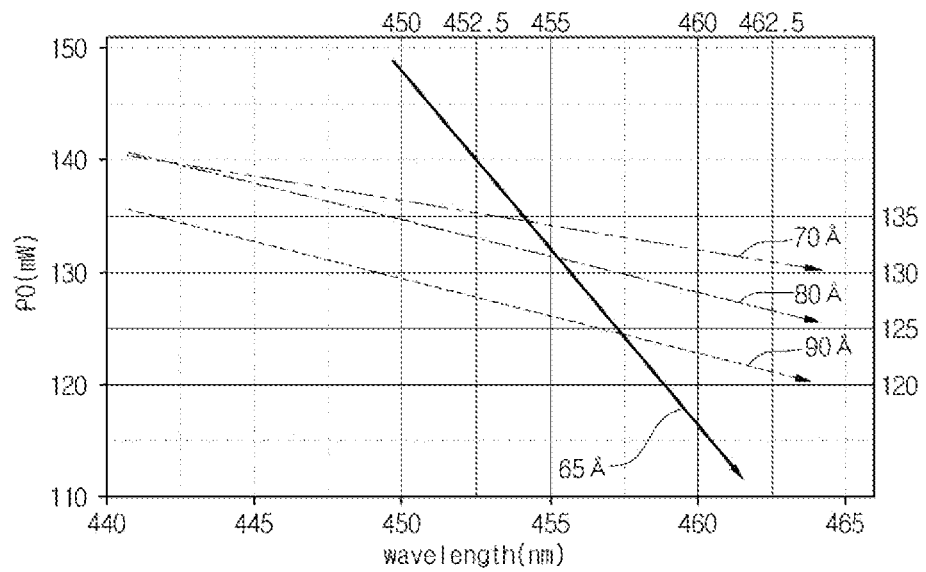
FIG. 3 is a graph showing optical power as a function of a thickness of the barrier layer.

FIG. 3 is a graph showing experimental data obtained by measuring the optical power Po of the light emitting device 1 after the thickness of the barrier layer is sequentially changed from 65 Å to 70 Å, 80 Å and 90 Å. As shown in FIG. 3, as the thickness of the barrier layer increases, the optical power Po lowers.

As the thickness of the barrier layer is reduced to 90 Å, 80 Å, and 70 Å, the optical power may increase at the peak wavelength 450 nm or more. In other words, optical power may be stronger in the barrier layer having the thickness of 80 Å rather than the barrier layer having the thickness of 90 Å. In addition, the optical power may be stronger in the barrier layer having the thickness of 70 Å rather than the barrier layer having the thickness of 80 Å. However, in the case of all of the barrier layers having the thickness of 90 Å, the barrier layer having the thickness of 80 Å, and the barrier layer having the thickness of 70 Å, as the wavelength increases, the optical power is gradually reduced. Especially, in the case of the barrier layer having the thickness 65 Å, the optical power is rapidly reduced.

In this case, all barrier layers included in the active layer may have equal thicknesses. For instance, the thickness of all barrier layers included in the active layer may be 90 Å.

As shown in FIG. 3, as the thickness of the barrier layer is reduced, the optical power is enhanced, but the driving voltage may increase. As the thickness of the barrier layer is reduced, the bulk resistance of the active layer increases, and the driving voltage increases due to the increase of the bulk resistance. In other words, the flow of current is interrupted due to the increase of the bulk resistance. Accordingly, in order to allow desirable current to flow, higher driving voltage is required.

According to the embodiment, the light emitting device capable of enhancing the CRI and the optical power while lowering the driving voltage can be realized.

Figure 4:
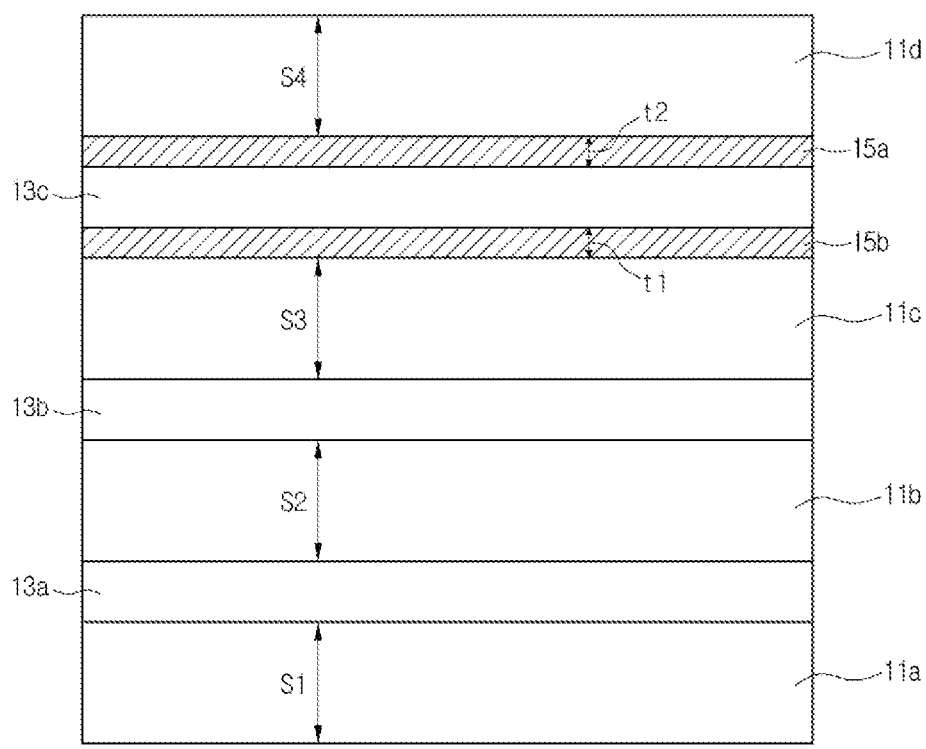
FIG. 4 is a sectional view showing an active layer according to the first embodiment in the light emitting device of FIG. 1.

FIG. 4 is a sectional view showing an active layer according to the first the embodiment in the light emitting device of FIG. 1.

Referring to FIG. 4, the active layer 10 may include a plurality of barrier layers 11a, 11b, 11c, and 11d, a plurality of well layers 13a, 13b, and 13c, and first and second dummy layers 15a and 15b.

The well layers 13a, 13b, and 13c may be provided between the barrier layers 11a, 11b, 11c, and 11d. For instance, the first well layer 13a may be disposed on the first barrier layer 11a, the second barrier layer 11b may be disposed on the first well layer 13a, and the second well layer 13b may be disposed on the second barrier layer 11b. The third barrier layer 11c may be disposed on the second well layer 13b, the third well layer 13c may be disposed on the third barrier layer 11c, and the fourth barrier layer 11d may be disposed on the third well layer 13c.

The first to third well layers 13a 13b, and 13c may be filled with electrons or holes that are supplied from the related adjacent barrier layers 11a, 11b, 11c, and 11d. The electrons and the holes may be recombined with each other to generate light.

The first and second dummy layers 15a and 15b may contact the third well layer 13c. In other words, the first dummy layer 15a may contact both of the fourth barrier layer 11d and the third well layer 13c, and the second dummy layer 15b may contact both of the third well layer 13c and the third barrier layer 11c, but the embodiment is not limited thereto.

The first and second dummy layers 15a and 15b may be included in the third and fourth barrier layers 11c and 11d, respectively. Accordingly, the thickness of each of the third and fourth barrier layers 11c and 11d including the first and second dummy layers 15a and 15b increases, so that the band bending caused by the lattice constant difference between the third well layer 13c and the fourth barrier layer 11d may be relieved, thereby increasing the optical power.

Accordingly, even if the composition of the compound semiconductor material of the third well layer 13c greatly contributing to the light emission is adjusted so that when a mean peak of 450 nm or more is formed, the quality of the active layer 10 is not affected.

In addition, the first and second dummy layers 15a and 15b are formed in contact with the third barrier layer 11c and the fourth barrier layer 11d adjacent to the second conductive semiconductor layer 9, so that the increase of the whole bulk resistance can be minimized and the optical power can increase.

The active layer 10 according to the embodiment may generate light having the peak wavelength of 450 nm or more, but the embodiment is not limited thereto.

Although FIG. 4 shows that the first and second dummy layers 15a and 15b are disposed at both sides of the third well layer 13c, the second dummy layer 15b may be disposed between N well layers adjacent to the second conductive semiconductor layer 9 and N barrier layers adjacent to the N well layers. In this case, N is a natural number of 1 or more (N≥1).

In this case, the total number of the well layers may be T, and the total number of the barrier layers may be "T+1" in which T>N. Although not shown, the second dummy layer 15b may be disposed between the second well layer 13b and the third barrier layer 11c. In other words, the second well layer 13b may be disposed on the second barrier layer 11b, the second dummy layer 15b may be disposed on the second well layer 13b, and the third barrier layer 11c may be disposed on the second dummy layer 15b. In this case, the second dummy layer 15b increases the thickness of the third barrier layer 11c to relieve the band bending caused by the lattice constant difference between the second well layer 13b and the third barrier layer 11c, thereby increasing the optical power.

For instance, the first to fourth barrier layers 11a, 11b, 11c, and 11d may have thicknesses S1, S2, S3, and S4 of about 5 nm, respectively. The first and second dummy layers 15a and 15b may have thicknesses t1 and t2 of about 2 nm, respectively, but the embodiment is not limited thereto.

The first and second dummy layers 15a and 15b may have the thicknesses t1 and t2 in the range of about 2 nm to about 4 nm, but the embodiment is not limited thereto. The thickness of 2 nm or less may hardly be formed in view of the current technology, and the thickness of 4 nm or more may lower the optical power.

Figure 5:
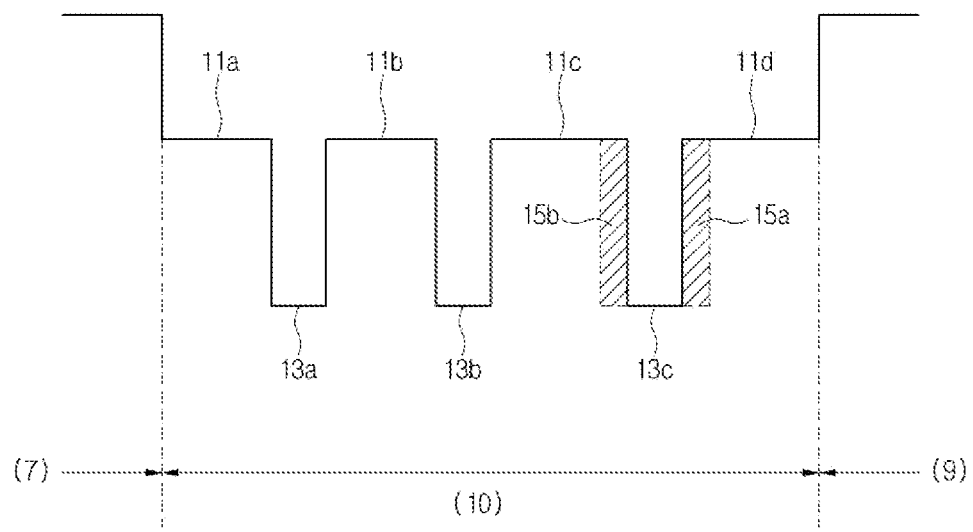
FIG. 5 is an energy band diagram for the active layer of FIG. 4.

FIG. 5 is an energy band diagram for the active layer of FIG. 4. Although FIG. 5 shows the energy band diagram of a conduction band for the explanation convenience, the energy band diagram covers both of a conduction band and a valance band.

As shown in FIG. 5, the first to fourth barrier layers 11a, 11b, 11c, and 11c may have equal energy bandgap, which is greater than that of the first to third well layers 13a, 13b, and 13c. Therefore, the first to third well layers 13a, 13b, and 13c may be filled with electrons or holes passing through the first to fourth barrier layers 11a, 11b, 11c, and 11d.

For instance, the first to fourth barrier layers 11a, 11b, 11c, and 11d may include one of GaN, AlGaN and InGaN, and the first to third well layers 13a, 13b, and 13c may include InGaN, but the embodiment is not limited thereto.

At least one of the first conductive semiconductor layer 7 or the second conductive semiconductor layer 9 may have a bandgap equal to or greater than that of the first to fourth barrier layers 11a, 11b, 11c, and 11d, but the embodiment is not limited thereto. For instance, the first conductive semiconductor layer 7 or the second conductive semiconductor layer 9 may include GaN or AlGaN, but the embodiment is not limited thereto.

The first and second dummy layers 15a and 15b may have the energy bandgap equal to that of the first to fourth barrier layers 11a, 11b, 11c, and 11d, but the embodiment is not limited thereto.

The first and second dummy layers 15a and 15b may include a compound semiconductor material the same as that of the first to fourth barrier layers 11a, 11b, 11c, and 11d, but the embodiment is not limited thereto.

Therefore, the first and second dummy layers 15a and 15b allow the thickness S3+t1 of the third barrier layer 11c and the thickness S4+t2 of the fourth barrier layer 11d to substantially be increase, thereby preventing band bending.

As described above, the second dummy layer 15b may be disposed between the second well layer 13b and the third barrier layer 11c, but the embodiment is not limited thereto.

When the second dummy layer 15b is disposed between the second well layer 13b and the third barrier layer 11c, or between the third barrier layer 11c and the third well layer 13c, the second dummy layer 15b may allow the thickness S3+t1 of the third barrier layer 11c to be increased.

Figure 6:
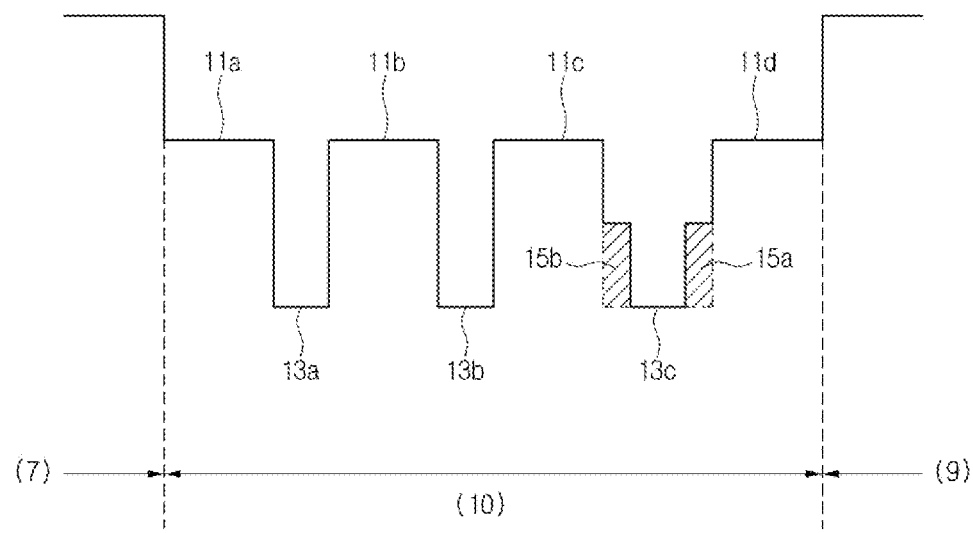
FIG. 6 is an energy band diagram for the active layer of FIG. 4.

FIG. 6 is an energy band diagram for the active layer of FIG. 4. Although FIG. 6 shows the energy band diagram of the conduction band for the explanation convenience, the energy band diagram covers both of the conduction band and the valance band.

As shown in FIG. 6, the first to fourth barrier layers 11a, 11b, 11c, and 11c may have equal energy bandgap, which is greater than that of the first to third well layers 13a, 13b, and 13c.

The first and second dummy layers 15a and 15b may include a compound semiconductor material the same as that of the first to fourth barrier layers 11a, 11b, 11c, and 11d, but the embodiment is not limited thereto.

At least one of the first dummy layer or the second dummy layer 15a and 15b may have the energy bandgap less than that of the first to fourth barrier layers 11a, 11b, 11c, and 11c, but the embodiment is not limited thereto. In other words, the first and second dummy layers 15a and 15b may have the energy bandgap greater than that of the first to third well layers 13a, 13b, and 13c, and less than that of the first to fourth barrier layers 11a, 11b, 11c, and 11c, but the embodiment is not limited thereto. In other words, the first and second dummy layers 15a and 15b may have the bandgap between the bandgap of the first to third well layers 13a, 13b, and 13c and the bandgap of the first to fourth barrier layers 11a, 11b, 11c, and 11c.

As first and second dummy layers 15a and 15b have the bandgap less than that of the first to fourth barrier layers 11a, 11b, 11c, and 11c, electrons or holes may be more easily injected into the well layer 13c, so that the larger quantity of light can be generated to improve the internal quantum efficiency, but the embodiment is not limited thereto.

The first and second dummy layers 15a and 15b allow the thickness S3+t1 of the third barrier layer 11c and the thickness S4+t2 of the fourth barrier layer 11d to be increase, thereby preventing band bending.

As described above, the second dummy layer 15b may be disposed between the second well layer 13b and the third barrier layer 11c, but the embodiment is not limited thereto.

When the second dummy layer 15b is disposed between the second well layer 13b and the third barrier layer 11c, or between the third barrier layer 11c and the third well layer 13c, the second dummy layer 15b may allow the thickness S3+t1 of the third barrier layer 11c to be increased.

Figure 7:
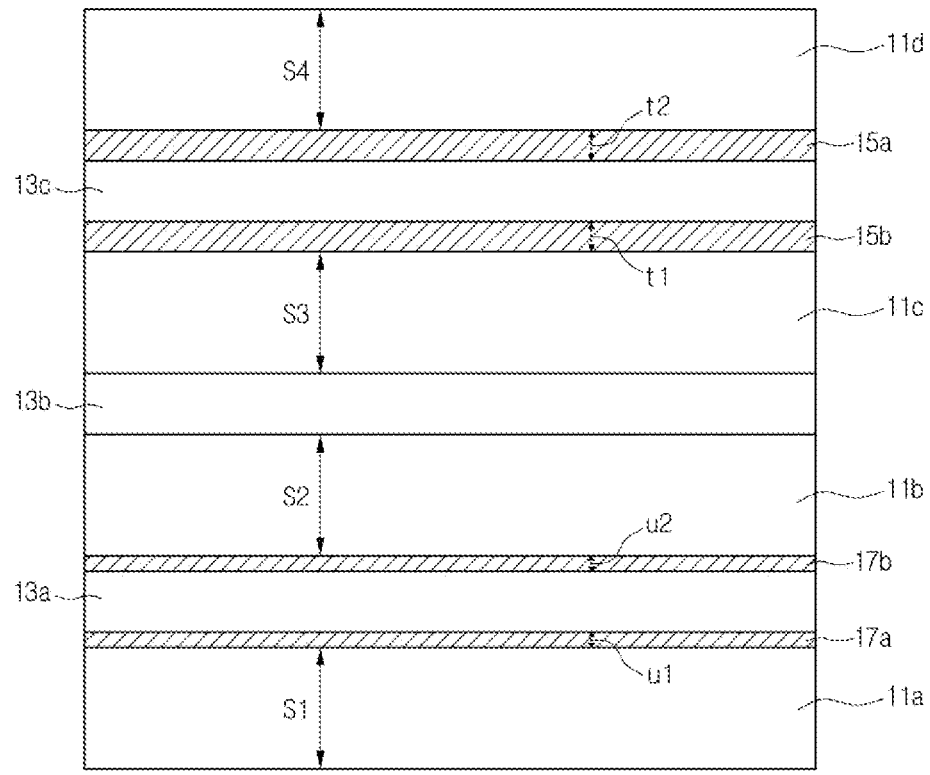
FIG. 7 is a sectional view showing an active layer according to the second embodiment in the light emitting device of FIG. 1.

FIG. 7 is a sectional view showing an active layer according to the second embodiment in the light emitting device of FIG. 1.

Referring to FIG. 7, the active layer 10 may include the barrier layers 11a, 11b, 11c, and 11d, the well layers 13a, 13b, and 13c, and first to fourth dummy layers 15a and 15b, and 17a and 17b.

The well layers 13a, 13b, and 13c may be disposed between the barrier layers 11a, 11b, 11c, and 11d. For instance, the first well layer 13a may be disposed on the first barrier layer 11a, the second barrier layer 11b may be disposed on the first well layer 13a, and the second well layer 13b may be disposed on the second barrier layer 11b. The third barrier layer 11c may be disposed on the second well layer 13b, the third well layer 13c may be disposed on the third barrier layer 11c, and the fourth barrier layer 11d may be disposed on the third well layer 13c.

The first to third well layers 13a 13b, and 13c may be filled with electrons or holes supplied from the related adjacent barrier layers 11a, 11b, 11c, and 11d. The electrons and the holes may be recombined with each other to generate light.

The first and second dummy layers 15a and 15b may contact the third well layer 13c. In other words, the first dummy layer 15a may contact both of the fourth barrier layer 11d and the third well layer 13c, and the second dummy layer 15b may contact both of the third well layer 13c and the third barrier layer 11c, but the embodiment is not limited thereto.

The first and second dummy layers 15a and 15b increase the thicknesses of the third barrier layer 11c and the fourth barrier layer 11d, respectively, to relieve the band bending caused by the lattice constant difference between the third well layer 13c and the fourth barrier layer 11d, thereby increasing the optical power.

Although not shown, the first dummy layer 15a may be interposed between the second well layer 13b and the third barrier layer 11c. In other words, the second well layer 13b may be disposed on the second barrier layer 11b, the second dummy layer 15b may be disposed on the second well layer 13b, and the third barrier layer 11c may be disposed on the second dummy layer 15b. In this case, the second dummy layer 15b increases the thickness of the third barrier layer 11c to relieve the band bending caused by the lattice constant difference between the second well layer 13b and the third barrier layer 11c, thereby increasing the optical power.

The third and fourth dummy layers 17a and 17b may contact the first well layer 13a. In other words, the third dummy layer 17a may contact both of the first barrier layer 11a and the first well layer 13a, and the fourth dummy layer 17b may contact both of the first well layer 13a and the second barrier layer 11b, but the embodiment is not limited thereto.

The third and fourth dummy layers 17a and 17b increase the thicknesses of the first barrier layer 11a and the second barrier layer 11b, respectively, to relieve the band bending caused by the lattice constant difference between the first well layer 13a and the second barrier layer 11b, thereby increasing the optical power.

The third and fourth dummy layers 17a and 17b may include a compound semiconductor material the same as that of the first to fourth barrier layers 11a, 11b, 11c, and 11d, but the embodiment is not limited thereto.

Although FIG. 7 shows that the third and fourth dummy layers 17a and 17b are disposed at both sides of the first well layer 13a, the fourth dummy layer 17b may be disposed between M well layers adjacent to the first conductive semiconductor layer 7 and M barrier layers adjacent to the M well layers. In this case, M is a natural number of 1 or more (M≥1).

In addition, although FIG. 7 shows that the first and second dummy layers 15a and 15b are disposed at both sides of the third well layer 13c, the second dummy layer 15b may be disposed between N well layers adjacent to the second conductive semiconductor layer 9 and N barrier layers adjacent to the N well layers. In this case, N is a natural number of 1 or more (N≥1).

In this case, the N may be equal to or different from the M. For instance, the N may be greater than the M, but the embodiment is not limited thereto.

In this case, the total number of the well layers is T, and the total number of the barrier layers may be "T+1" in which T>N≥M.

Although not shown, the fourth dummy layer 17b may be interposed between the second barrier layer 11b and the second well layer 13b. In other words, the fourth dummy layer 17b may be disposed on the second barrier layer 11b, and the second well layer 13b may be disposed on the fourth dummy layer 17b. In this case, the fourth dummy layer 17b increases the thickness of the second barrier layer 11b to relieve the band bending caused by the lattice constant difference between the second well layer 13b and the second barrier layer 11b, thereby increasing the optical power.

The first and second dummy layers 15a and 15b may have the thicknesses different from those of the third and fourth dummy layers 17a and 17b. For instance, the first to fourth barrier layers 11a, 11b, 11c, and 11d may have the thicknesses S1, S2, S3, and S4 of about 5 nm, and the first and second dummy layers 15a and 15b may have the thicknesses t1 and t2 of about 2 nm. The third and fourth dummy layers 17a and 17b may have the thicknesses u1 and u2 of 1 nm, but the embodiment is not limited thereto.

For instance, the first and second dummy layers 15a and 15b may have the thicknesses t1 and t2 in the range of about 2 nm to about 4 nm, and the third and fourth dummy layers 17a and 17b may have the thicknesses u1 and u2 in the range of about 1 nm to about 2 nm, but the embodiment is not limited thereto.

Figure 8:
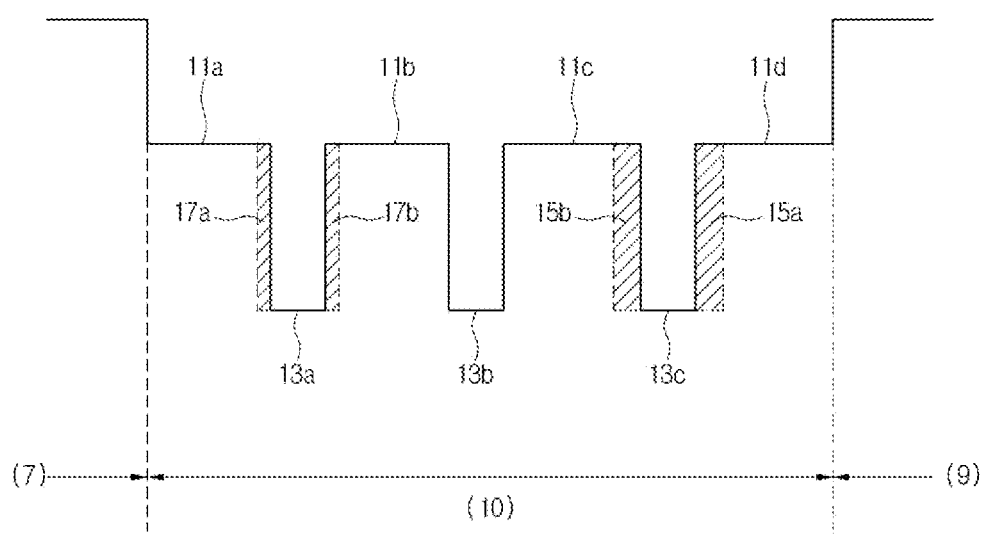
FIG. 8 is an energy band diagram for the active layer of FIG. 7.

FIG. 8 is an energy band diagram for the active layer of FIG. 7. Although FIG. 8 shows the energy band diagram of a conduction band for the explanation convenience, the energy band diagram covers both of the conduction band and the valance band.

The following description will be made while focusing on the third and fourth dummy layers because the energy band diagram of FIG. 8 is substantially similar to that of FIG. 5 except for the third and fourth dummy layers.

As shown in FIG. 8, the first to fourth barrier layers 11a, 11b, 11c, and 11c may have equal energy bandgap, which is greater than that of the first to third well layers 13a, 13b, and 13c.

The first and second dummy layers 15a and 15b may have the energy bandgap equal to that of the first to fourth barrier layers 11a, 11b, 11c, and 11d, but the embodiment is not limited thereto.

The first and second dummy layers 15a and 15b may include a compound semiconductor material the same as that of the first to fourth barrier layers 11a, 11b, 11c, and 11d, but the embodiment is not limited thereto.

Therefore, the first and second dummy layers 15a and 15b substantially increase the thickness S3+t1 of the third barrier layer 11c and the thickness S4+t2 of the fourth barrier layer 11d to prevent band bending.

In addition, the third and fourth dummy layers 17a and 17b may have the energy bandgap equal to that of the first to fourth barrier layers 11a, 11b, 11c, and 11d, but the embodiment is not limited thereto.

The third and fourth dummy layers 17a and 17b may include a compound semiconductor material the same as that of the first to fourth barrier layers 11a, 11b, 11c, and 11d, but the embodiment is not limited thereto.

Therefore, the third and fourth dummy layers 17a and 17b allow the thickness S3+u1 of the first barrier layer 11a and the thickness S2+u2 of the second barrier layer 11b to be increase, thereby preventing band bending.

Figure 9:
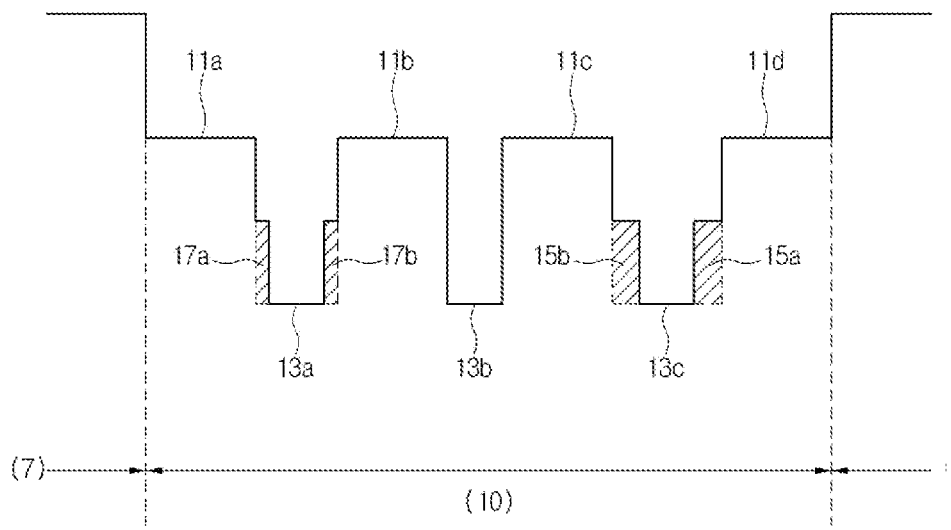
FIG. 9 is an energy band diagram for the active layer of FIG. 7.

FIG. 9 is an energy band diagram for the active layer of FIG. 7. Although FIG. 9 shows the energy band diagram of the conduction band for the explanation convenience, the energy band diagram covers both of the conduction band and the valance band.

The following description will be made while focusing on the third and fourth dummy layers because the energy band diagram of FIG. 8 is substantially similar to that of FIG. 6 except for the third and fourth dummy layers.

As shown in FIG. 9, the third and fourth dummy layers 17a and 17b may have the energy bandgap less than that of the first to fourth barrier layers 11a, 11b, 11c, and 11c, but the embodiment is not limited thereto. In other words, the third and fourth dummy layers 17a and 17b may have the energy bandgap greater than that of the first to third well layers 13a, 13b, and 13c, and less than that of the first to fourth barrier layers 11a, 11b, 11c, and 11c, but the embodiment is not limited thereto. In other words, the third and fourth dummy layers 17a and 17b may have the bandgap between the bandgap of the first to third well layers 13a, 13b, and 13c and the bandgap of the first to fourth barrier layers 11a, 11b, 11c, and 11c.

The third and fourth dummy layers 17a and 17b allow the thickness S3+u1 of the first barrier layer 11a and the thickness S2+u2 of the second barrier layer 11b to be increased, thereby preventing band bending.

As described above, the fourth dummy layer 17b may be interposed between the second barrier layer 11b and the second well layer 13b, but the embodiment is not limited thereto.

Figure 10:
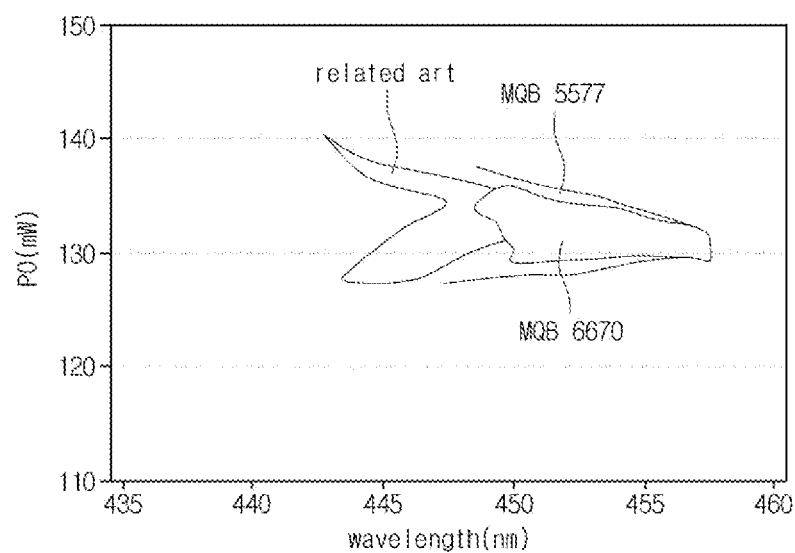
FIG. 10 is a graph showing optical power as a function of a wavelength according to the related art and the embodiments.

FIG. 10 is a graph showing optical power as a function of a wavelength according to the related art and the embodiments.

As shown in FIG. 10, according to the related art, optical power is mainly distributed at the peak wavelength of 450 nm or less. On the contrary, according to the first and second embodiments, the optical power is mainly distributed at the peak wavelength of 450 nm or more, and the optical power increases more than that of the related art.

In this case, the first embodiment may relate to the light emitting device including the active layer according to the first embodiment of FIG. 4, and relate to "MQB 5577" of FIG. 10. The second embodiment may relate to the light emitting device including the active layer according to the second embodiment of FIG. 7, and relate to "MQB 6670" of FIG. 10.

Figure 11:
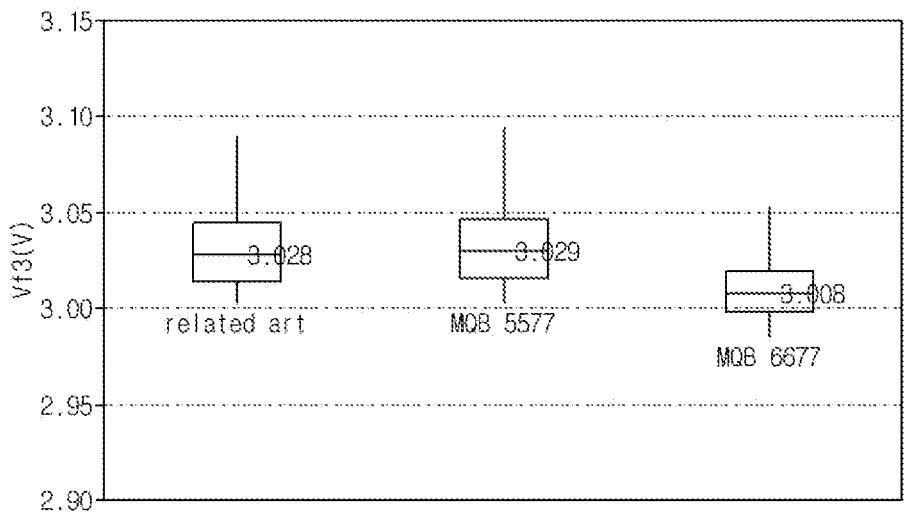
FIG. 11 is a graph showing the driving voltage according to the related art and the embodiments.

FIG. 11 is a graph showing the driving voltage according to the related art and the embodiments.

The driving voltage according to the related art may be 3.028 V, the driving voltage according to the first embodiment may be 3.029 V, and the driving voltage of the second embodiment may be 3.008 V.

In particular, the driving voltage of the second embodiment is lower than that of the related art even though the thickness of the barrier layer of the second embodiment is thicker than that of the barrier layer according to the related art.

As recognized from FIGS. 10 and 11, the light emitting device according to the embodiment represents an improved CRI and improved optical power at the peak wavelength of 450 nm or more, and represents the lower driving voltage.

As described above, although description has been made in that the dummy layer is distinguished from the barrier layer, the dummy layer and the barrier layer may be regarded as one layer. In other words, the first dummy layer 15a is included in the fourth barrier layer 11d so that the thickness of the fourth barrier layer 11d may be defined as S4+t2, and the second dummy layer 15b is included in the third barrier layer 11d, so that the thickness of the third barrier layer 11c may be defined as S3+t1. The third dummy layer 17a is included in the first barrier layer 11a so that the thickness of the first barrier layer 11a may be defined as S1+u1, and the fourth dummy layer 17b is included in the second barrier layer 11b, so that the thickness of the second barrier layer 11b may be defined as S2+u2.

Figure 12:
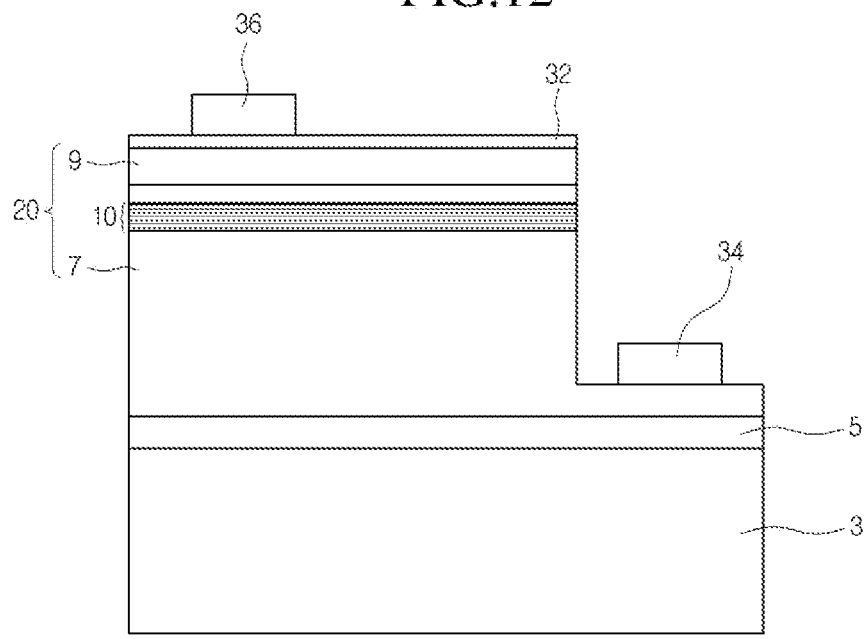
FIG. 12 is a sectional view showing a lateral type light emitting device according to the embodiment.
Figure 13:
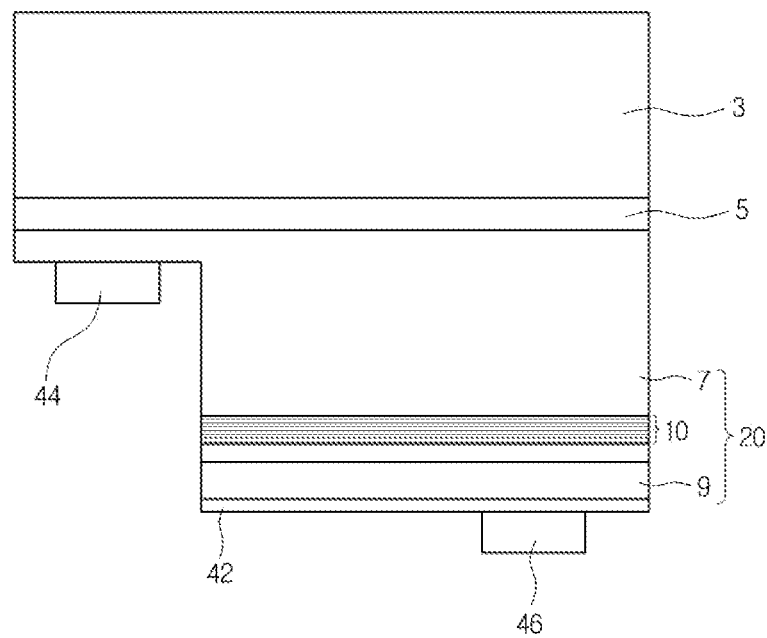
FIG. 13 is a sectional view showing a flip type light emitting device according to the embodiment.
Figure 14:
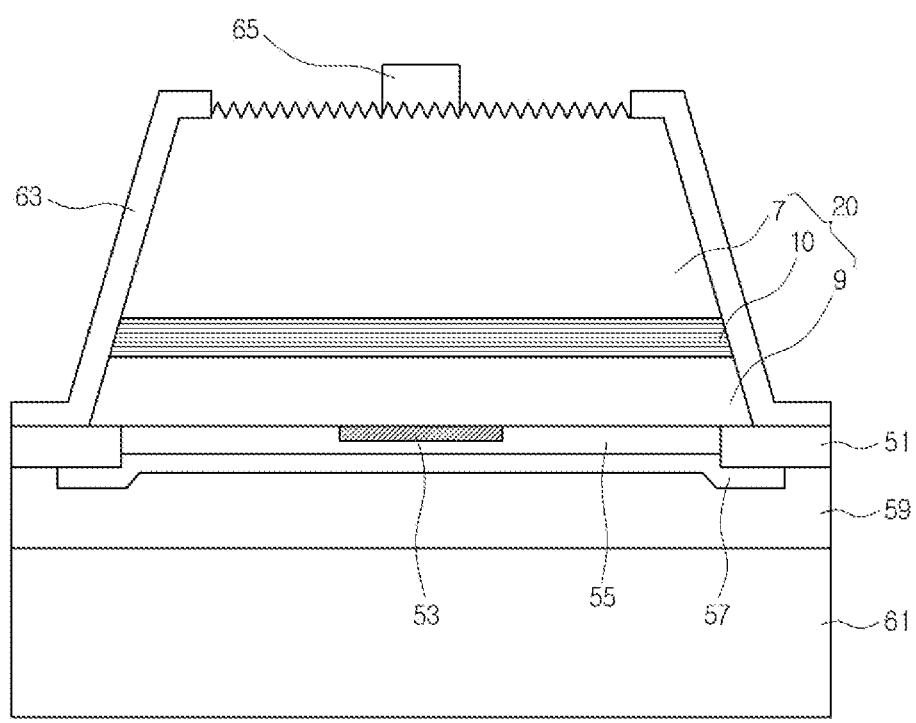
FIG. 14 is a sectional view showing a vertical type light emitting device according to the embodiment.

FIGS. 12 to 14 are sectional views showing a product to which the light emitting device of FIG. 1 is actually applied.

FIG. 12 is a sectional view showing a lateral type light emitting device according to the embodiment.

Referring to FIG. 12, the lateral type light emitting device according to the embodiment may include the substrate 3, the buffer layer 5, the light emitting structure 20, a conductive layer 32, and first and second electrodes 34 and 36.

Since the substrate 3, the buffer layer 5, and the light emitting structure 20 have been described in detail, the details thereof will be omitted in order to avoid redundancy.

The conductive layer 32 may be disposed on the light emitting structure 20, in detail, on the second conductive semiconductor layer 9. If a third conductive semiconductor layer including conductive dopants the same as those of the first conductive semiconductor layer 7 is disposed on the second conductive semiconductor layer 9, the conductive layer 32 may be disposed on the third conductive semiconductor layer.

The conductive layer 32 spreads current or makes ohmic contact with the light emitting structure 20, so that the current can more easily flow through the light emitting structure 20, but the embodiment is not limited thereto.

The conductive layer 32 may include a transparent conductive material allowing light to pass therethrough. The transparent conductive material may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, but the embodiment is not limited thereto.

The first electrode 34 may be electrically connected to the first conductive semiconductor layer 7, and the second electrode 36 may be electrically connected to the conductive layer 32, but the embodiment is not limited thereto.

The first and second electrodes 34 and 36 may include one selected from the group consisting of, for example, Al, Ti, Cr, Ni, Pt, Au, W, Cu and Mo or the stack structure thereof, but the embodiment is not limited thereto.

Although not shown, a current blocking layer may be disposed to prevent current from being concentrated on the lower portion of each of the first and second electrodes 34 and 36.

FIG. 13 is a sectional view showing a flip type light emitting device according to the embodiment.

FIG. 13 shows the structure similar to that of FIG. 12 except for the reflective layer.

Referring to FIG. 13, the flip type light emitting device according to the embodiment may include the substrate 3, a buffer layer 5, the light emitting structure 20, a reflective layer 42, and first and second electrodes 44 and 46.

The buffer layer 5 may be disposed under the substrate 3, and the light emitting structure 20 may be disposed under the buffer layer 5. The reflective layer 42 may be disposed under the light emitting structure 20, the first electrode 44 may be disposed under the first conductive semiconductor layer 7, and the second electrode 46 may be disposed under the second conductive semiconductor layer 9, but the embodiment is not limited thereto.

Since the substrate 3, the buffer layer 5, and the light emitting structure 20 have been described in detail, the detail thereof will be omitted in order to avoid redundancy.

The reflective layer 42 may be disposed on the light emitting structure 20, in detail, on the second conductive semiconductor layer 9. When a third conductive semiconductor layer including conductive dopants the same as those of the first conductive semiconductor layer 7 is disposed under the second conductive semiconductor layer 9, the reflective layer 42 may be disposed under the third conductive semiconductor layer.

The reflective layer 42 reflects upward light, which is generated from the active layer 10 and directed downward, so that the light emission efficiency can be improved, but the embodiment is not limited thereto.

The reflective layer 42 includes a reflective material representing a superior reflection characteristic. For example, the reflective layer 42 may include one selected from the group consisting of, for example, Ag, Ni, Al, Rh, Pd, Ir, Ru, Mg, Zn, Pt, Au, and Hf, or the stack structure thereof, but the embodiment is not limited thereto.

If the reflective layer 42 represents an inferior ohmic contact characteristic with respect to the second conductive semiconductor layer 9, a conductive layer (not shown) may be disposed between the second conductive semiconductor layer 9 and the reflective layer 42, but the embodiment is not limited thereto. The conductive layer may include a transparent material representing a superior ohmic contact characteristic with respect to the second conductive semiconductor layer 9. For example, the conductive layer may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, but the embodiment is not limited thereto.

FIG. 14 is a sectional view showing a vertical type light emitting device according to the embodiment.

In the following description referring to FIG. 14, the details of components having the same functions as those of components shown in FIG. 12 will be omitted.

Referring to FIG. 14, the vertical type light emitting device according to the embodiment may include a support substrate 61, an adhesion layer 59, an electrode layer 57, an ohmic contact layer 55, a current blocking layer 53, a channel layer 51, a protective layer 63, and an electrode 65.

The support substrate 61 may not only support a plurality of layers formed thereon, but serve as an electrode.

The support substrate 61 may include at least one of titanium (Ti), chrome (Cr), nickel (Ni), aluminum (Al), platinum (Pt), gold (Au), tungsten (W), copper (Cu), molybdenum (Mo) and copper-tungsten (Cu—W).

The adhesion layer 59 serves as a bonding layer, and is interposed between the electrode layer 57 and the support substrate 61. The adhesion layer 59 may serve as a medium to enhance the adhesive strength between the electrode layer 57 and the support substrate 61.

For instance, the adhesion layer 59 may include at least one selected from the group consisting of Ti, Au, Sn, Ni, Nb, Cr, Ga, In, Bi, Cu, Ag and Ta.

The electrode layer 57 serves as an electrode to supply power to the active layer 10, and reflects upward light, which is generated from the active layer 10 and directed downward. The electrode layer 57 may be named a reflective layer.

If the electrode layer 57 represents a superior ohmic contact characteristic with respect to the second conductive semiconductor layer 9, the ohmic contact layer 55 may be omitted. In this case, the electrode layer 57 may have an electrode function, a reflective function, and an ohmic contact function.

The electrode layer 57 may include one selected from the group consisting of, for example, Ag, Ni, Al, Rh, Pd, Ir, Ru, Mg, Zn, Pt, Au, and Hf, or the stack structure thereof, but the embodiment is not limited thereto.

The channel layer 51 may be formed along the peripheral region between the electrode layer 57 and the second conductive semiconductor layer 9. The channel layer 51 may be surrounded by both of the electrode layer 57 and the second conductive semiconductor layer 9 if the ohmic contact layer 55 is omitted.

The channel layer 51 may prevent the electrical short from occurring between the lateral side of the electrode layer 57 and the lateral side of the light emitting structure 20 due to external foreign matters.

The channel layer 51 may include an insulating material, for example, at least one of selected from the group consisting of $SiO_2$, $SiO_x$, $SiO_xN_y$, $Si_3N_4$, and $Al_2O_3$.

In order to prevent current from being concentrated, the current blocking layer 53 may be interposed between the second conductive semiconductor layer 9 and the electrode layer 57.

The current blocking layer 53 may overlap with a portion of the electrode 65.

In the vertical type light emitting device, since the electrode layer 57 has the shape of a plate, and the electrode 65 is formed in the shape of a pattern only at a portion of the light emitting structure 20, if power is applied to the electrode 65 and the electrode layer 57, current flow may be concentrated in a vertical direction under the electrode 65. Therefore, the current blocking layer 53 is disposed at a position vertically overlapping with the electrode 65, so that the current vertically flowing through the electrode 65 is dispersed to the peripheral portion of the current blocking layer 53.

The current blocking layer 53 may have electrical conductivity less than that of the electrode layer 57, have an electrical insulating property greater than that of the electrode layer 57, or have a material to make schottky contact with the light emitting structure 20. The current blocking layer 53 may include, for example, at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, TiOx, Ti, Al and Cr. In this case, the $SiO_2$, $SiO_x$, $SiO_xN_y$, $Si_3N_4$, and $Al_2O_3$ may be insulating materials.

The protective layer 63 may be disposed around the lateral side of the light emitting structure 20. A portion of the protective layer 63 contacts the top surface of the channel layer 51, and another portion of the protective layer 63 may be disposed at a peripheral region of the top surface of the first conductive semiconductor layer 7.

The protective layer 63 may prevent electrical short from occurring between the light emitting structure 20 and the support substrate 61. For instance, the protective layer 63 may include an insulating material including one selected from the group consisting of $SiO_2$, $SiO_x$, $SiO_xN_y$, $Si_3N_4$, $TiO_2$ and $Al_2O_3$, but the embodiment is not limited thereto.

The protective layer 63 may include a material the same as that of the channel layer 51, but the embodiment is not limited thereto.

The first conductive semiconductor layer 7 may be provided at a top surface thereof with a light extraction structure to effectively extract light. The light extraction structure may have a concave-convex structure or a roughness structure. The concave-convex structure may be uniformly or randomly formed.

The electrode 65 may be disposed on the light extraction structure.

For example, the electrode 65 may include one selected from the group consisting of Al, Ti, Cr, Ni, Pt, Au, W, Cu and Mo, or the stack structure thereof, but the embodiment is not limited thereto.

Figure 15:
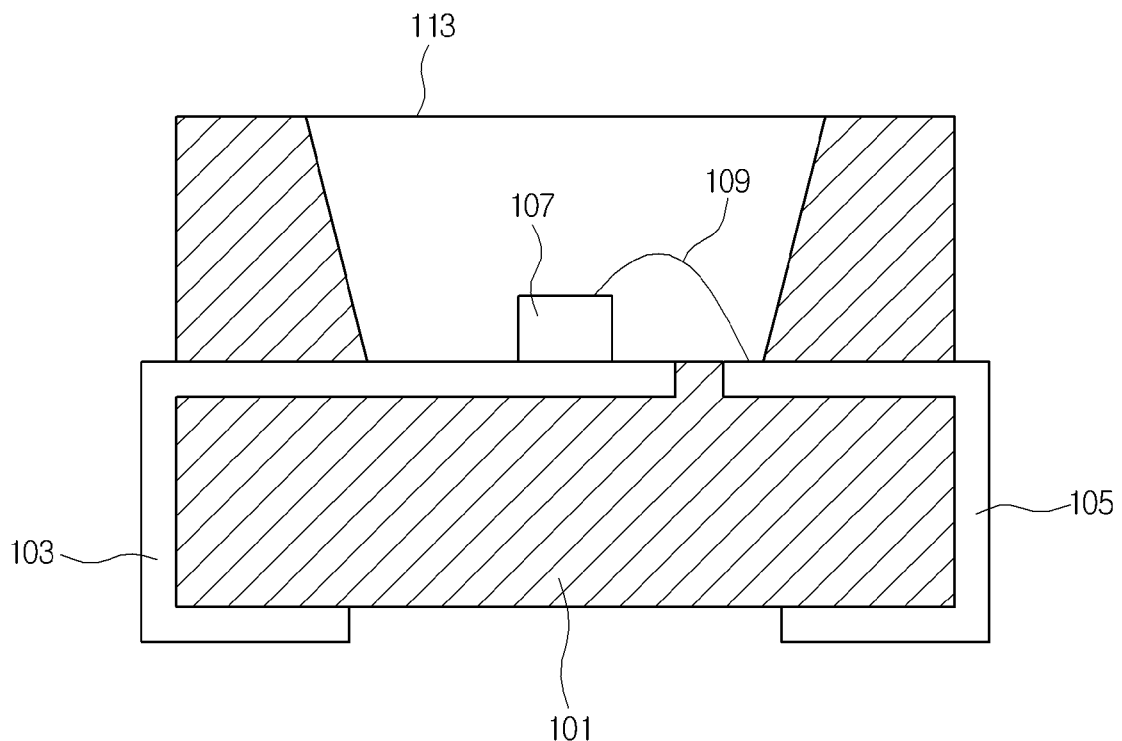
FIG. 15 is a sectional view showing a light emitting device package according to the embodiment.

FIG. 15 is a sectional view showing a light emitting device package according to the embodiment.

Referring to FIG. 15, the light emitting device package according to the embodiment includes a body 101, first and second electrode lines 103 and 105 installed in the body 101, a light emitting device 107 to receive power from the first and second electrode lines 103 and 105, and a molding member 113 surrounding the light emitting device 107.

The body 101 may include a silicon material, a synthetic resin material, or a metallic material, and may have the inclined surfaces formed around the light emitting device 107.

The first and second electrode lines 103 and 105 are electrically insulated from each other to supply power to the light emitting device 107.

In addition, the first and second electrode lines 103 and 105 reflect light generated from the light emitting device 107 to increase the light efficiency and discharge heat generated from the light emitting device 107 to the outside.

The light emitting device 107 may be installed on one of the first electrode line 103, the second electrode line 105, and the body 101. The light emitting device 107 may be electrically connected to the first and second electrode lines 103 and 105 through a wire scheme or a die bonding scheme, but the embodiment is not limited thereto. For example, one side of the light emitting device 107, for example, the bottom surface of the light emitting device 107 may be electrically connected to the top surface of the first electrode line 103, and an opposite side of the light emitting device 107 may be electrically connected to the second electrode line 105 through the wire 109.

The light emitting device 107 according to the embodiment may be one of the lateral type light emitting device, the flip-chip light emitting device, and the vertical type light emitting device described above, but the embodiment is not limited thereto.

The molding member 113 may surround the light emitting device 107 to protect the light emitting device 107. In addition, the molding member 113 includes phosphors so that the wavelength of the light emitted from the light emitting device 107 may be converted.

The light emitting device package according to the embodiment may have a chip on board (COB), the body 101 may have a flat top surface, and a plurality of light emitting devices 107 may be installed in the body 101.

According to the embodiment, dummy layers having bandgap similar to those of barrier layers are formed in adjacent to the barrier layers, so that the CRI and the optical power can be improved, and the voltage can lower at the peak wavelength of 450 nm or more.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive semiconductor layer;
an active layer on the first conductive semiconductor layer; and a second conductive semiconductor layer on the active layer,
wherein the active layer comprises:
(T+1) barrier layers;
T well layers between the (T+1) barrier layers; and
a first dummy layer between N well layers adjacent to the second conductive semiconductor layer and N barrier layers adjacent to the N well layers, in which T>N≥1,
wherein the first conductive semiconductor layer comprises an n-type semiconductor layer,
wherein the second conductive semiconductor layer comprises a p-type semiconductor layer,
wherein the active layer comprises a last well layer most adjacent to the p-type semiconductor layer among well layers,
wherein the active layer comprises a last barrier layer most adjacent to the p-type semiconductor layer among barrier layers,
wherein the first dummy layer is disposed between the last well layer and the p-type semiconductor layer,
wherein the first dummy layer has a bandgap less than a bandgap of the last barrier layer,
wherein the active layer comprises a third barrier layer most adjacent to the last barrier layer,
wherein the active layer comprises a second dummy layer between the last well layer and the third barrier layer,
wherein the last well layer is disposed between the first dummy layer and the second dummy layer,
wherein the active layer comprises a third dummy layer between a first barrier layer in contact with the n-type semiconductor layer and a first well layer provided between the first barrier layer and a second barrier layer,
wherein the third dummy layer is spaced apart from the first dummy layer, and
wherein a thickness of the third dummy layer is less than a thickness of the first dummy layer.

2. The light emitting device of claim 1, wherein each of the first and third dummy layers has a thickness in a range of about 2 nm to about 4 nm.

3. The light emitting device of claim 1, wherein the first dummy layer is disposed on one of a top surface and a bottom surface of the second barrier layer contacting the first well layer.

4. The light emitting device of claim 2, wherein the first dummy layer or the third dummy layer has a bandgap between a bandgap of the first well layer and a bandgap of the first barrier layer.

5. The light emitting device of claim 2, wherein the first dummy layer or the third dummy layer includes the same compound semiconductor material as a compound semiconductor material of the first barrier layer.

6. The light emitting device of claim 1, wherein the (T+1) barrier layers have equal thicknesses.

7. The light emitting device of claim 1, wherein the active layer generates a light having a peak wavelength of 450 nm or more.

8. A light emitting device comprising:
a substrate;
a first conductive semiconductor layer on the substrate;
an active layer on the first conductive semiconductor layer; and
a second conductive semiconductor layer on the active layer,
wherein the first conductive semiconductor layer comprises an n-type semiconductor layer,
wherein the second conductive semiconductor layer comprises a p-type semiconductor layer,
wherein the active layer comprises:
first to fourth barrier layers; and
first to third well layers between the first to fourth barrier layers, and
wherein the third well layer is most adjacent to the p-type semiconductor layer among the first to third well layers, and
wherein the first barrier layer contacts the first conductive semiconductor layer, the fourth barrier layer contacts the second conductive semiconductor layer, and the third and fourth barrier layers have thicknesses greater than thicknesses of the first and second barrier layers, respectively,
wherein the fourth barrier layer is a last barrier layer most adjacent to the p-type semiconductor layer among barrier layers,
wherein the active layer comprises a first dummy layer disposed between the third well layer most adjacent to the p-type semiconductor layer and the p-type semiconductor layer,
wherein the first dummy layer has a bandgap less than a bandgap of the last barrier layer,
wherein the third barrier is most adjacent to the last barrier layer,
wherein the active layer comprises a second dummy layer between the third well layer and the third barrier layer, and
wherein the third well layer is disposed between the first dummy layer and the second dummy layer,
wherein the active layer comprises a third dummy layer between a first barrier layer in contact with the first conductive semiconductor layer and a first well layer provided between the first barrier layer and the second barrier layer,
wherein the third dummy layer is spaced apart from the first dummy layer, and
wherein a thickness of the third dummy layer is less than a thickness of the first dummy layer.

9. The light emitting device of claim 8, wherein the thickness of each of the first and second barrier layers is about 5 nm, and the thickness of each of the third and fourth barrier layers is about 7 nm.

10. The light emitting device of claim 8, wherein the thickness of each of the first and second barrier layers is about 6 nm, and the thickness of each of the third and fourth barrier layers is about 7 nm.

11. The light emitting device of claim 8, wherein the first conductive semiconductor layer is an N type semiconductor layer, and the second conductive semiconductor layer is a P type semiconductor layer.

12. The light emitting device of claim 1,
wherein a thickness of the first dummy layer is less than a thickness of the last barrier layer.

13. The light emitting device of claim 1, wherein the fourth barrier layer is most adjacent to the p-type semiconductor layer among first to fourth barrier layers, and
wherein a thickness of the first dummy layer is less than a thickness of the fourth barrier layer.

14. The light emitting device of claim 1, wherein the second dummy layer has a bandgap less than the bandgap of the last barrier layer.

15. The light emitting device of claim 1, wherein the active layer further comprises a second well layer between the first well layer and the last well layer, and
  wherein the second well layer does not have a dummy layer.

16. The light emitting device of claim 8, wherein a maximum bandgap energy of the first dummy layer is less than a bandgap energy of the last barrier layer.

* * * * *